US012684682B2

(12) United States Patent
Tomimoto et al.

(10) Patent No.: US 12,684,682 B2
(45) Date of Patent: Jul. 14, 2026

(54) ELECTRONIC APPARATUS AND IMAGE PICKUP APPARATUS

(71) Applicant: CANON KABUSHIKI KAISHA, Tokyo (JP)

(72) Inventors: Honkai Tomimoto, Tokyo (JP); Hideki Kawashima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 130 days.

(21) Appl. No.: 18/501,089

(22) Filed: Nov. 3, 2023

(65) Prior Publication Data

US 2024/0074030 A1 Feb. 29, 2024

Related U.S. Application Data

(63) Continuation of application No. PCT/JP2022/015618, filed on Mar. 29, 2022.

(30) Foreign Application Priority Data

May 21, 2021 (JP) .................................. 2021-085775

(51) Int. Cl.
*H05K 1/02* (2006.01)
*H04N 23/52* (2023.01)
(Continued)

(52) U.S. Cl.
CPC ........... *H05K 1/0203* (2013.01); *H04N 23/52* (2023.01); *H04N 23/53* (2023.01); *H04N 23/54* (2023.01);
(Continued)

(58) Field of Classification Search
CPC .... H05K 1/0203; H05K 1/14; H05K 7/20272; H05K 2201/042; H05K 1/0209;
(Continued)

(56) References Cited

U.S. PATENT DOCUMENTS 10,869,384 B2 * 12/2020 Chen .................... H05K 1/0201
2009/0002549 A1 * 1/2009 Kobayashi ............. H04N 23/52
348/374

(Continued)

FOREIGN PATENT DOCUMENTS

JP 09-283886 A 10/1997
JP 2004-165586 A 6/2004
(Continued)

OTHER PUBLICATIONS

The above foreign patent documents 1-4, 7-9 and 11 were cited the International Search Report of PCT/JP2022/015618 May 7, 2022, a copy of which is enclosed.

(Continued)

*Primary Examiner* — Lin Ye
*Assistant Examiner* — Chan T Nguyen
(74) *Attorney, Agent, or Firm* — Cowan, Liebowitz & Latman, P.C.

(57) ABSTRACT

An electronic apparatus includes a first board having a heat generating element, a second board, a support member having a fixing part to which the second board is fixed, and which supports the second board so as to overlap with the first board separated by a distance, and a heat dissipation member on an opposite side of the first board across the second board and the support member, so as to overlap with the second board separated by a distance. The support member includes a heat receiving part thermally connected to the heat generating element, a first heat transfer part which transfers heat received by the heat receiving part to the heat dissipation member, and a second heat transfer part which transfers heat received by the fixing part to the heat dissipation member. The support member has a shape which reduces heat transfer from the heat receiving part to the fixing part.

18 Claims, 13 Drawing Sheets

(51) Int. Cl.

| | | |
|---|---|---|
| *H04N 23/53* | (2023.01) | |
| *H04N 23/54* | (2023.01) | |
| *H05K 1/14* | (2006.01) | |
| *H05K 7/20* | (2006.01) | |

(52) U.S. Cl.
CPC ........... *H05K 1/14* (2013.01); *H05K 7/20272* (2013.01); *H05K 2201/042* (2013.01)

(58) Field of Classification Search
CPC ........ H05K 1/141; H04N 23/52; H04N 23/53; H04N 23/54; G03B 17/02; G03B 17/55
USPC ..................................................... 348/333.01
See application file for complete search history.

(56) References Cited

U.S. PATENT DOCUMENTS

| | | | | |
|---|---|---|---|---|
| 2019/0385927 | A1* | 12/2019 | Shibata ................ | H10W 40/43 |
| 2020/0319307 | A1* | 10/2020 | Huh ....................... | G03B 17/55 |
| 2021/0397072 | A1* | 12/2021 | Ding ................... | H05K 1/0203 |

FOREIGN PATENT DOCUMENTS

| | | | |
|---|---|---|---|
| JP | 2014-187083 | A | 10/2014 |
| JP | 2017-011711 | A | 1/2017 |
| JP | 2019-008053 | A | 1/2019 |
| JP | 2019-179947 | A | 10/2019 |
| JP | 2019-213134 | A | 12/2019 |
| JP | 2020-010237 | A | 1/2020 |
| JP | 2020-194818 | A | 12/2020 |
| WO | 2004/112129 | A1 | 12/2004 |
| WO | 2014/073528 | A1 | 5/2014 |

OTHER PUBLICATIONS

Nov. 30, 2023 PCT/IB/338 (PCT Notification of Transmittal of Copies of Translation of the International Preliminary Report on Patentability) from International Application No. PCT/JP2022/015618.

Nov. 30, 2023 PCT/IB/373 (PCT International Preliminary Report on Patentability) from International Application No. PCT/JP2022/015618.

Nov. 30, 2023 PCT/ISA/237 (PCT Written Opinion of the International Searching Authority) from International Application No. PCT/JP2022/015618.

* cited by examiner

ELECTRONIC APPARATUS AND IMAGE PICKUP APPARATUS

CROSS-REFERENCE TO RELATED APPLICATIONS

This application is a Continuation of International Patent Application No. PCT/JP2022/015618, filed on Mar. 29, 2022, which claims the benefit of Japanese Patent Application No. 2021-085775, filed on May 21, 2021, both of which are hereby incorporated by reference herein in their entirety.

BACKGROUND

Technical Field

One of the aspects of the embodiments relates to an electronic apparatus such as an image pickup apparatus having a heat dissipation structure.

Description of Related Art

An electronic apparatus including an image pickup apparatus is provided with a heat dissipation structure to suppress a temperature rise of its housing. As a heat dissipation structure, Japanese Patent Laid-Open No. 2014-187083 discloses a heat dissipation structure in which a thermally conductive member is sandwiched between stacked substrates so that heat from the substrate whose temperature has increased due to an operation of the image pickup apparatus is transferred to the substrate whose temperature is lower. In addition, Japanese Patent Laid-Open No. 2017-11711 discloses an image pickup apparatus in which a heat transfer member is disposed in an area avoiding a substrate and a heat insulating member is provided around the heat transfer member.

Furthermore, Japanese Patent Laid-Open No. 2020-10237 discloses an image pickup apparatus having a first housing unit that holds a substrate on which a heat generating element is mounted, and a second housing unit that is spaced with respect to the first housing unit. The space formed by the above spacing forms an air flow path leading to an outside via a top opening exposed on a top surface of the image pickup apparatus and a back opening exposed on a back surface of the image pickup apparatus. A back part of the first housing unit has a heat dissipation structure that increases a surface area of a surface facing the second housing unit, and a thermal connection between electronic components and the heat dissipation structure enables heat dissipation from a heated circuit board to the outside.

In the heat dissipation structure of Japanese Patent Laid-Open No. 2014-187083, heat is transferred from a heat source to an exterior component through an intermediate component, and the heat can be dissipated from the exterior component to an outside air. However, if the intermediate component has low a heat transfer efficiency, a heat transfer efficiency to the exterior component decreases. For this reason, in a case where the intermediate component is a component that is sensitive to heat, the heat from the heat source cannot be transferred to the exterior component.

Further, in the heat dissipation structure of Japanese Patent Laid-Open No. 2017-11711, the heat transfer member is held by screwing the tip (thermal connecting part) of the heat transfer-member to the heat insulating member partially made of air. For this reason, without the screwing, the heat transfer member cannot be positioned with respect to the heat insulating member.

Further, in the heat dissipation structure of Japanese Patent Laid-Open No. 2020-10237, heat is dissipated using natural convection from the back surface to the top surface of the image pickup apparatus. However, if a heat amount generated from the circuit board is large, it is difficult to efficiently dissipate the heat from the circuit board to the outside only by the natural convection. In addition, since the opening for the heat dissipation is provided on the top surface of the image pickup apparatus, a thickness of the top surface of the image pickup apparatus increases, resulting in an increase in a size of the entire image pickup apparatus.

SUMMARY

An electronic apparatus according to one aspect of the embodiment includes a first board on which a heat generating element is mounted, a second board, a support member which includes a fixing part to which the second board is fixed, and which supports the second board so as to overlap with the first board separated by a distance, and a heat dissipation member which is arranged on an opposite side of the first board across the second board and the support member, so as to overlap with the second board separated by a distance. The support member includes a heat receiving part which is thermally connected to the heat generating element, a first heat transfer part which transfers heat received by the heat receiving part to the heat dissipation member, and a second heat transfer part which transfers heat received by the fixing part to the heat dissipation member. The support member has a shape which reduces heat transfer from the heat receiving part to the fixing part.

An electronic apparatus according to another aspect of the embodiment includes a first board on which a heat generating element is mounted, a second board, a support member to which the second board is fixed, and which supports the second board so as to overlap with the first board separated by a distance, a heat dissipation member arranged on an opposite side of the first board across the second board and the support member, so as to overlap with the second board separated by a distance, a heat transfer member which is thermally connected to the heat generating member, and which extends toward the heat dissipation member through an opening provided in the second board, and a heat insulating member which is arranged between the heat transfer member and the second board, and which has a lower thermal conductivity than the heat transfer member.

An image pickup apparatus according to another aspect of the embodiment includes a finder into which a user looks, a board on which a heat generating element is mounted, and a heat dissipation member to which the heat generating element is thermally connected, and which forms at least a part of a duct through which a cooling medium flows. The duct includes an inlet into which the cooling medium flows, and a first outlet and second outlet though which the cooling medium flows out. The inlet is provided on a bottom surface of the image pickup apparatus. The first outlet is provided on a side surface of the image pickup apparatus. The second outlet is provided on a side of the finder at an upper back surface of the image pickup apparatus. An opening area of the second outlet is smaller than an opening area of the first outlet.

Further features of the disclosure will become apparent from the following description of embodiments with reference to the attached drawings.

DESCRIPTION OF THE EMBODIMENTS

Referring now to the accompanying drawings, a detailed description will be given of embodiments according to the disclosure.

First Embodiment

Figure 1A:
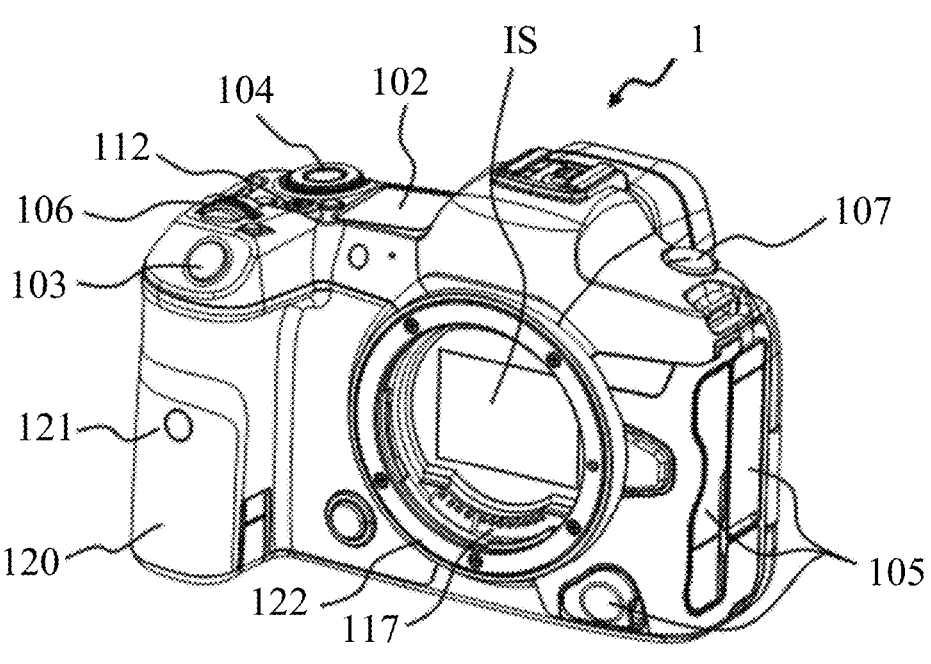
FIGS. 1A and 1B are a front side perspective view and a rear side perspective view of an image pickup apparatus according to the first embodiment, respectively.
Figure 1B:
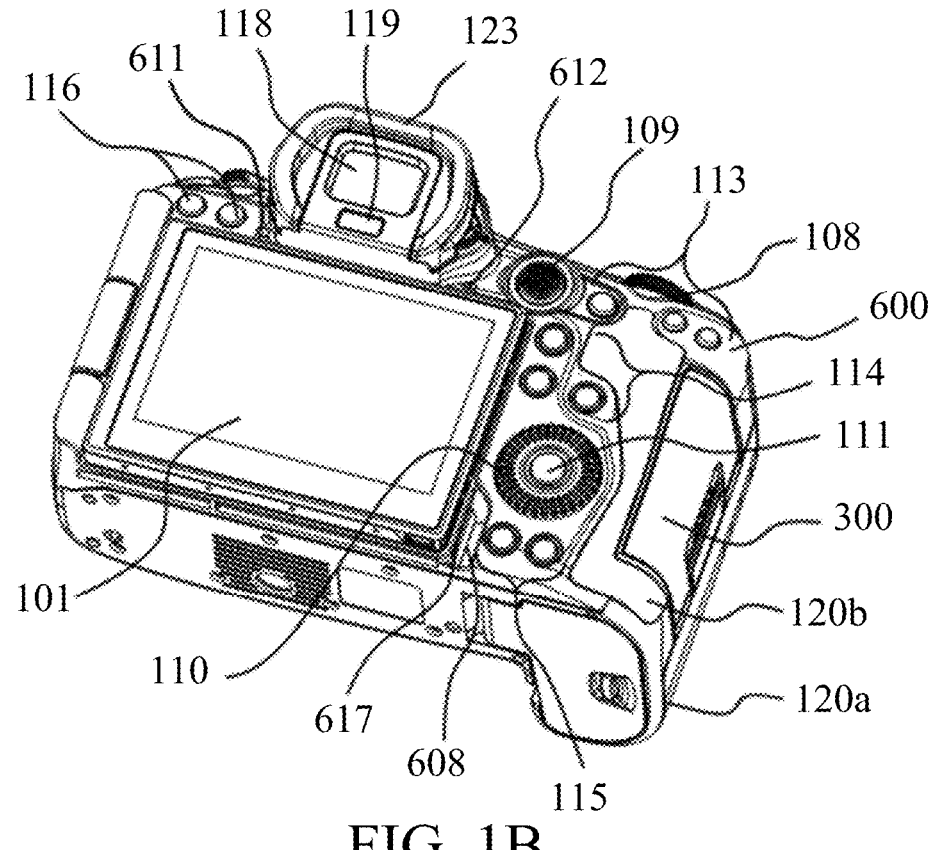

FIG. 1A shows a camera body (image pickup apparatus) 1 as an electronic apparatus viewed from an oblique front side of the camera body 1, and FIG. 1B shows the camera body 1 viewed diagonally from an oblique rear side of the camera body 1.

A display unit 101 provided on a back surface (rear surface) of the camera body 1 is attached to the camera body 1 so as to be openable and rotatable with respect to the camera body 1, and displays images generated by image capturing and various information on imaging. The display unit 101 is equipped with a touch panel, and can detect a user's touch operation on its display surface (operation surface). A finder outside display unit 102 provided on a top surface of the camera body 1 displays set values of various image pickup parameters such as shutter speed and aperture.

A shutter button 103 is an operation member operated by the user when the user instructs the camera body 1 to capture an image. A mode switch 104 is an operation member operated by the user when the user switches a mode between various modes. A terminal cover 105 is a cover that protects a connector (not shown) to which a connection cable extending from an external device is connected. A main electronic dial 106 is an operation member that is rotated by the user when the user changes set values of the image pickup parameters. A power switch 107 is an operation member operated by the user when the user switches a power of the camera body 1 on and off.

A sub-electronic dial 108 is an operation member operated by the user to move a selection frame such as an AF frame or to perform image feeding.

A multi-controller 109 is provided on the back surface of the camera body 1. The multi-controller 109 is configured to allow input by pressing a key top and tilting it in up, down, left, right, and oblique directions. By operating the multi-controller 109, the user can move the selection frame and select items on various menus.

A back electronic dial 110 is also an operation member operated by the user to move the selection frame or to perform image feeding. The back electronic dial 110 is arranged at a position where the user can easily operate it intuitively while playing back captured images on the display unit 101, and can also easily operate it even when the user holds the camera body 1 vertically. A SET button 111 is provided in a center of the back electronic dial 110. The SET button 111 is an operation member that serves as a push button that the user operates when deciding on a selection item or the like.

A video button 112 is an operation member operated by the user when instructing to start and stop video imaging (recording). A button group 113 is operation members related to focus and exposure, and includes an AF start button, an AE lock button, and an AF frame selection button, which are arranged horizontally. When the user presses the button group 113 in an image pickup standby state, it is possible to start the AF, change the AF frame, or fix the exposure.

A button group 114 includes an enlargement/reduction button, an information display button, and a quick setting button, which are arranged in an L shape. By operating the enlargement/reduction button in a live view display state in an image pickup mode, the user can turn on/off the enlargement of a live view display image. Furthermore, by operating the enlargement/reduction button in a playback mode, the user can turn on/off the enlargement of a captured image being played back. By operating the information display button, the user can switch a display method of information displayed on the display unit 101. When the user operates the quick setting button, a display on the display unit 101 can be immediately changed to a screen for changing setting values of image pickup parameters.

A button group 115 includes a playback button and a delete button. The user can switch a mode between the image pickup mode and the playback mode by operating the playback button. When the playback button is operated in the image pickup mode, the mode shifts to the playback mode, and the latest captured image among the captured images recorded on a recording card (not shown) can be displayed on the display unit 101. The user who has selected a captured image in the playback mode can delete the selected captured image by operating the delete button.

A button group 116 includes a menu button and a rating button. When the user operates the menu button, a menu screen displaying settable items is displayed on the display unit 101. The user can intuitively select items and make settings by touching on the menu screen displayed on the display unit 101 or by operating the multi-controller 109 or the back electronic dial 110 and the SET button 111. By operating the rating button in the playback mode, the user can rate (rank) the playback images.

An interchangeable lens (not shown) is removably mounted on a mount part 122. A communication terminal 117 provided inside the mount part 122 is used for communication between the camera body 1 and the interchangeable lens. An image sensor IS configured with a CMOS sensor or the like is provided at the back of the mount part 122. A direction in which the mount part 122 and the image sensor IS are arranged is referred to as a front-back direction in the following description. The front-back direction can also be referred to as an optical axis direction parallel to an optical axis of the interchangeable lens mounted on the mount part 122.

A finder 118 provided on an upper back side of the camera body 1 is an electronic viewfinder, and allows the user looking into the finder to view a live view display image and the like. An eye contact detection window 119 is a detection window for an eye contact detection sensor that detects that the user is looking into (approaching) the finder 118. An eyepiece cover 123 is a rubber member that comes into contact with a face around the eyes of the user when looking into the finder 118.

A grip part 120 is a gripping part having a shape that allows the user holding the camera body 1 to easily grip it with his/her right hand. A front rubber 121 is provided on the grip part 120 to prevent the hand from slipping.

A card lid 300 is a lid that covers a slot (not shown) that stores the recording card. The card lid 300 is provided at a part of the grip part 120 that the user's palm touches.

Figure 2:
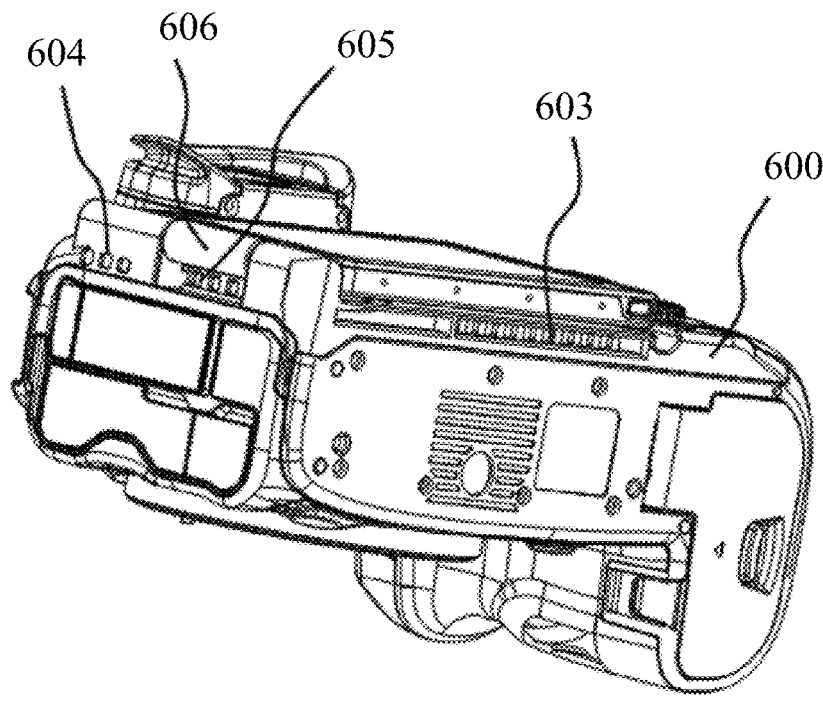
FIG. 2 is a bottom side perspective view of the image pickup apparatus according to the first embodiment.

FIG. 2 shows the camera body 1 viewed from the bottom side. As shown in FIGS. 1B and 2, openings 611 and 612 as second outlets (exhaust outlets) for heat dissipation are provided on both sides of the finder 118 at an upper back of a back cover 600 so as to be exposed. In a rear view, the opening 611 is provided on a left side of the finder 118, and the opening 612 is provided on a right side of the finder 118. The opening 611 is provided at a position lower than a key top (convex surface) of the button group 116 between the button group 116 and the finder 118. The opening 612 is provided at a position lower than a key top of the multi-controller 109 between the multi-controller 109 and the finder 118.

An opening 603 serving as an inlet (air intake inlet) for heat dissipation is provided on a bottom surface of the back cover 600 so as to be exposed. The opening 603 is provided only on a right half in the rear view at a position adjacent to a storage part of the display unit 101.

Openings 604 and 605 as first outlets (exhaust outlets) for heat dissipation are provided on a left side of the back cover 600 when viewed from the rear side. The openings 604 and 605 are adjacent to the storage part of the display unit 101 and are located from a center to a top when viewed from the rear side. The opening 605 is located behind a hinge cover 606 which covers an open/close axis of the display unit 101.

The back cover 600 is formed with a recessed part 608 into which a user's finger can be inserted for opening and closing the display unit 101. The presence of the recessed part 608 allows the user to easily open and close the display unit 101. Furthermore, an opening 617 as a third outlet (exhaust outlet) for heat dissipation is provided on a surface of the back cover 600 that faces the recessed part 608 (a surface facing right in FIG. 1B).

Figure 3:
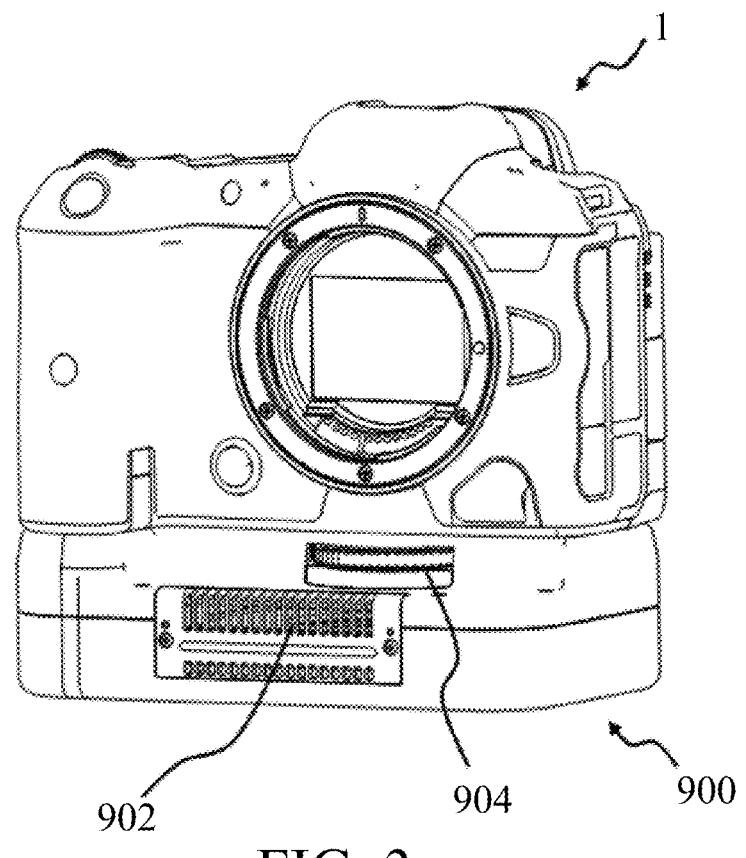
FIG. 3 is a perspective view of the image pickup apparatus according to the first embodiment with a fan accessory attached.
Figure 4:
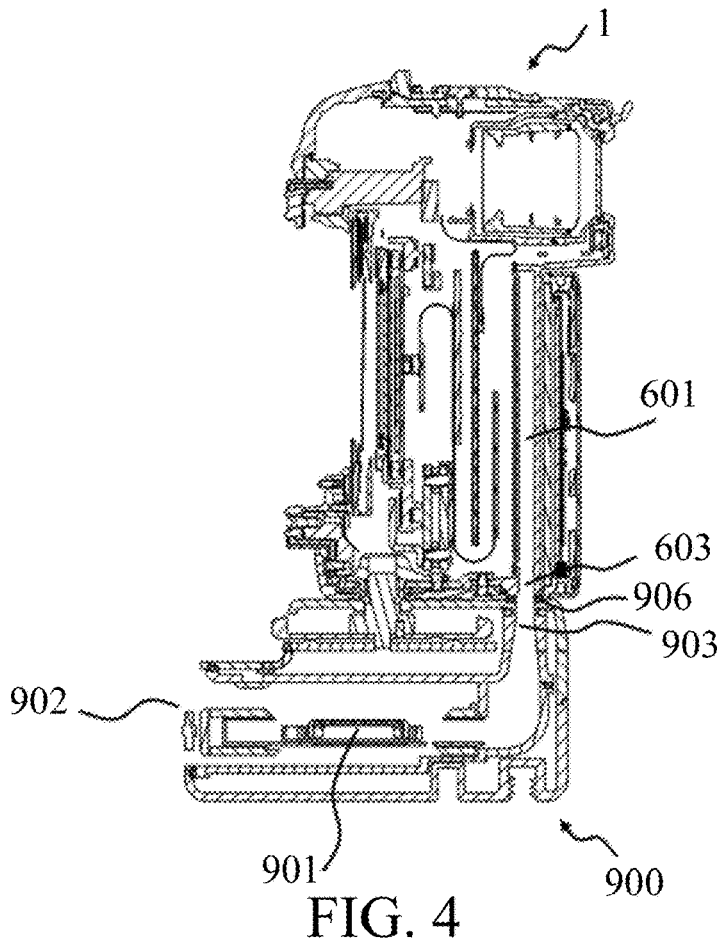
FIG. 4 is a cross-sectional view of the image pickup apparatus according to the first embodiment with the fan accessory attached.

FIG. 3 shows the camera body 1 with an accessory 900 attached. FIG. 4 shows a side-view cross-section of the camera body 1 and the accessory 900. The accessory 900 is a fan unit that can send air as a refrigerant from a fan 901 installed inside it to the camera body 1. An air intake inlet 902 is provided on a front surface of the accessory 900, and an air outlet 903 facing the aforementioned opening 603 of the camera body 1 is provided on a top surface of the accessory 900. The accessory 900 is fixed to the camera body 1 by screwing a tripod screw member 904 provided on the accessory 900 into a tripod seat provided on the bottom surface of the camera body 1. The accessory 900 also includes a power supply (not shown), and a fan can be driven by power supplied from this power supply without using power of the camera body 1.

An elastic member 906 is provided around the air outlet 903 of the accessory 900, and the elastic member 906 connects the air outlet 903 and the opening 603 of the camera body 1 so that there is no gap around the air outlet 903 and the opening 603. When the fan 901 rotates, air (outside air) taken in from the air intake inlet 902 is transmitted to the air outlet 903. Air from the air outlet 903 flows into a duct 601 provided on the back side of the camera body 1 through the opening 603 serving as an intake inlet (inlet). Air flowing into the duct 601 flows while receiving heat from inside the camera body 1 and is discharged to the outside of the camera body 1 through the openings 604, 605, 611, 612, and 617 as exhaust outlets shown in FIG. 2.

Figure 5:
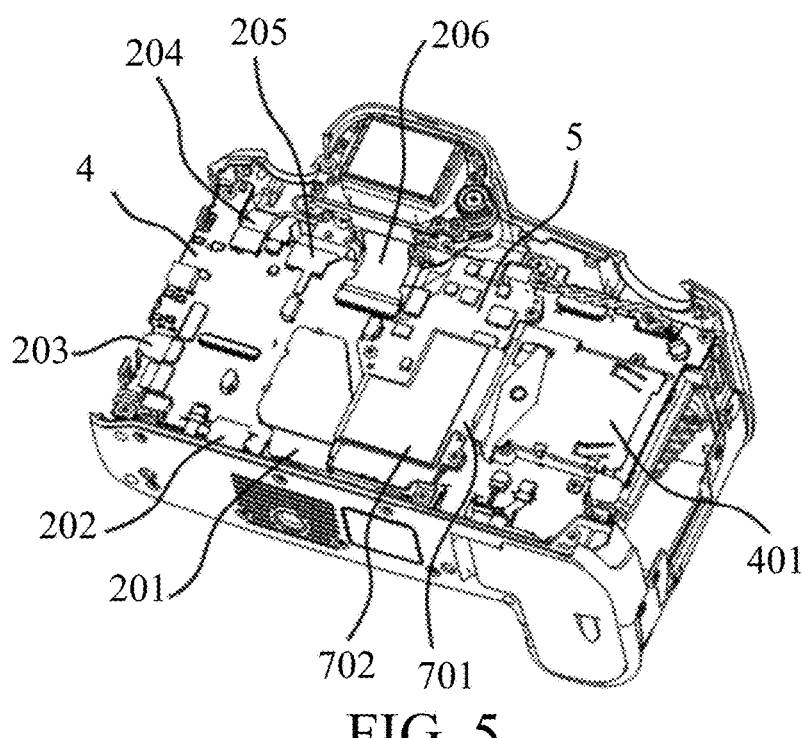
FIG. 5 is an exploded perspective view of the image pickup apparatus according to the first embodiment.

FIG. 5 shows the camera body 1 with the back cover 600 and card lid 300 removed. Inside the camera body 1, a main board (or substrate) 4 as a first board (or substrate) and a power supply board 5 as a second board are arranged. The power supply board 5 is a smaller board than the main board 4 and is supported by a plate 701 as a U-shaped bent support member so that it overlaps the main board 4 at a predetermined distance in the front-back direction. The power supply board 5 is arranged at a position that does not overlap wirings 201, 202, 203, 204, 205, and 206 connected to the main board 4.

Figure 6:
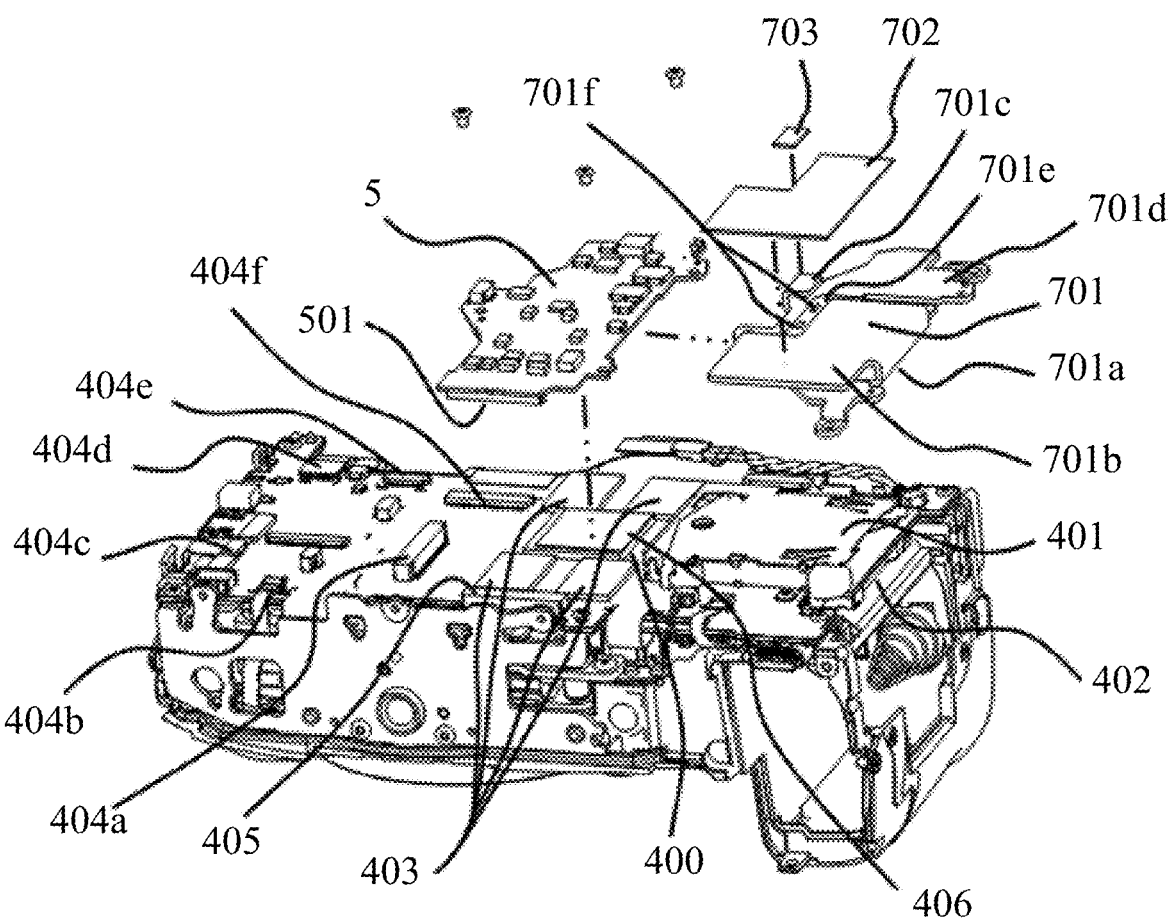
FIG. 6 is an exploded perspective view of the vicinity of a substrate in the image pickup apparatus according to the first embodiment.

FIG. 6 shows the camera body 1 with a top cover, a bottom cover, etc. removed and the vicinity of the power supply board 5 disassembled. An image processing IC (image processing element) 400 that performs various image processing on signals output from the image sensor IS to generate image data is mounted on the main board 4. A DRAM 403 is mounted on the main board 4 near the image processing IC 400. The DRAM 403 temporarily stores data necessary for image processing. Further, the main board 4 is provided with connection parts 404a, 404b, 404c, 404d, 404e, and 404f for the wirings 201 to 206 described above.

A first card slot 401 is arranged on the back side near the grip side of the image processing IC 400, and a second card slot 402 is arranged on the front side. The first card slot 401 is a slot into which a first card (for example, an XQD card or a CF Express card) is inserted. The second card slot 402 is a slot into which a second card (for example, an SD card) is inserted. The card slots do not have to be double slots into which different types of cards are inserted as described above, but may be single slots or double slots into which cards of the same type are inserted.

The image processing IC 400 is a heat generating element that is a main heat source in the main board 4. It generates a lot of heat and becomes hot during high loads, for example, when capturing moving images with high pixels and high frame rates, because it consumes a large amount of power to perform high-speed processing.

Some of components related to the power supply cannot be mounted on the main board 4 due to restrictions on a size of the main board 4 and component layout. Components related to the power supply that cannot be mounted on the main board 4 are mounted on the power supply board 5. By arranging the power supply board 5 so as to overlap the main board 4, the size of the camera body 1 when viewed from the front can be reduced.

The power supply board 5 is inserted into the plate 701 before being connected to the main board 4, and in this state is arranged so as to overlap the main board 4 in the front-back direction. The power supply board 5 is connected to the main board 4 by engaging a connector 501 provided on the power supply board 5 with a connector 405 provided on the main board 4. A position of the power supply board 5 with respect to the main board 4 is also determined by the engagement of the connectors 501 and 405. The power supply board 5 and the plate 701 are fastened and fixed to the camera body 1 together with screws.

A thermally conductive rubber 406 is attached to the image processing IC 400 on the main board 4. When the power supply board 5 and the plate 701 are assembled, the plate 701 and the thermally conductive rubber 406 come into contact (close contact).

The plate 701 is a member formed from a metal material, such as a sheet metal of aluminum, copper, or stainless steel with high thermal conductivity. As shown in FIG. 6, the plate 701 includes a first heat transfer part 701b and a second heat transfer part 701c, each of which is bent into a U shape, and a heat receiving surface 701a as one surface of a heat receiving part. The heat receiving surface 701a is in contact with the thermally conductive rubber 406 and is thermally connected to the image processing IC 400. Heat generated by the image processing IC 400 is transmitted to the plate 701 from this heat receiving surface 701a.

Furthermore, the plate 701 includes a fixing surface 701d with which the power supply board 5 comes into contact at a fixing part where the power supply board 5 is fixed, and an escape surface 701e that is the other surface of the heat receiving part. The escape surface 701e is a surface that is recessed relative to the fixing surface 701d so as to be separated from the power supply board 5, and is formed by half-blanking or the like. The first heat transfer part 701b is connected to the heat receiving part having the escape surface 701e and the heat receiving surface 701a. The second heat transfer part 701c is connected to the fixing part having the fixing surface 701d.

A thermally conductive rubber 702 and a thermally conductive rubber 703 are attached to the first heat transfer part 701b and the second heat transfer part 701c of the plate 701, respectively. These thermally conductive rubbers 702 and 703 are used for thermal connection, which will be described later. By using the plate 701 in this way, it is possible to arrange the main board 4 and the power supply board 5 so that the image processing IC 400, the power supply board 5, and a part of the first heat transfer part 701b that is thermally connected to a duct heat sink 705 (to which the thermally conductive rubber 702 is attached) overlap one another in the front-back direction, separated by a distance.

Figure 7:
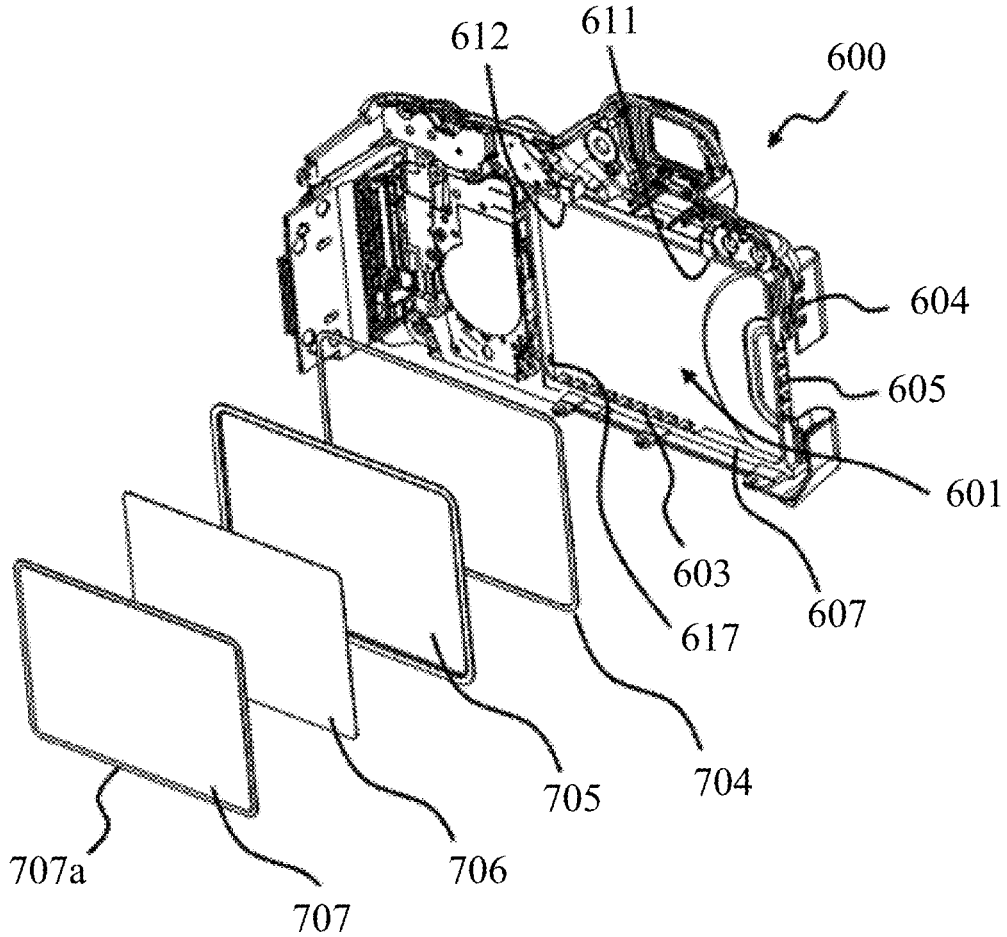
FIG. 7 is an exploded perspective view of a back cover of the image pickup apparatus according to the first embodiment.

FIG. 7 shows components that form the duct 601 in disassembled form. The back cover 600 has a duct-forming part including a partition wall with the storage part that houses the display unit 101 and a wall part (rib) 607 surrounding four sides thereof. The wall part 607 projects forward from the partition wall. The duct 601 is formed by assembling the duct-forming part to the wall part 607 so as to cover the duct-forming part with the duct heat sink 705 serving as a heat dissipation member.

A size (width) of the duct 601 is set to be approximately the same as the width of the display unit 101 so as to be widest in order to reduce ventilation resistance. The size of a space inside the duct 601 does not need to be the maximum depending on the ventilation resistance and the position of the heat source, and can be changed depending on a balance with exhaust heat. The wall part 607 has a shape in which there are no openings other than the aforementioned openings 603, 604, 605 and openings 611, 612, 617 in order to maintain airtightness.

The duct heat sink 705 is a component made by drawing a metal plate material such as aluminum having high thermal conductivity so that its center is convex toward a duct side. Since the central part of the duct heat sink 705 has a shape that is convex toward the duct side, it is possible to align the back cover 600 as a lid with respect to the duct-forming part and secure a space for arranging a thin heat dissipation component 707, which will be described later. In a case where an aluminum plate is used as the duct heat sink 705, it is preferable to perform black alumite treatment for heat dissipation and corrosion resistance.

The duct heat sink 705 is attached and fixed to an inner surface of the wall part 607 with a rectangular frame-shaped double-sided tape 704. The double-sided tape 704 is attached to the inner surface of the wall part 607 of the back cover 600 without any gaps, allowing air to flow through the duct 601 without pressure loss due to air leakage, and also preventing water and dust from entering the camera body 1.

On an opposite side of the duct side of the convex-shaped part described above in the duct heat sink 705, the thin heat dissipation component 707 is attached with ultra-thin double-sided tape 706 to increase heat diffusion efficiency. The thin heat dissipation component 707 is provided for the purpose of supplementing the heat diffusion of the duct heat sink 705, and a vapor chamber is used in this embodiment. The vapor chamber may be changed to a graphite sheet, or the thermally conductive rubber 702 may be brought into direct contact with the duct heat sink 705 without providing the thin heat dissipation component 707.

Further, even if the attachment using double-sided tape 706 is changed to close fixation using thermally conductive grease, the thin heat dissipation component 707 can be held because the fixation surface is wide, and an improvement in the heat-transfer efficiency can be expected.

Figure 8A:
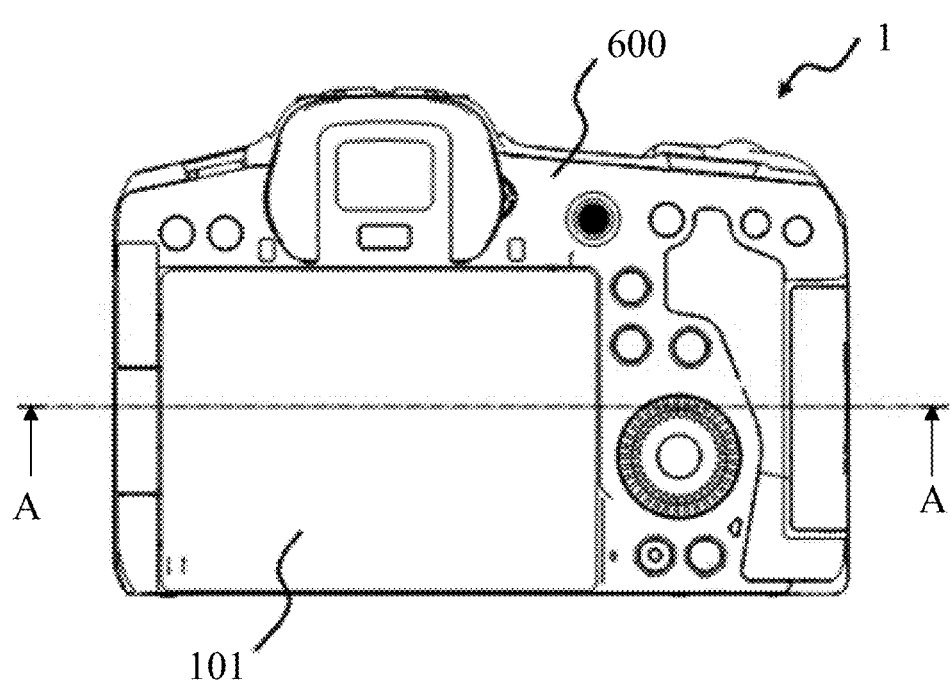
FIGS. 8A and 8B are a cross-sectional view of the image pickup apparatus according to the first embodiment.
Figure 8B:
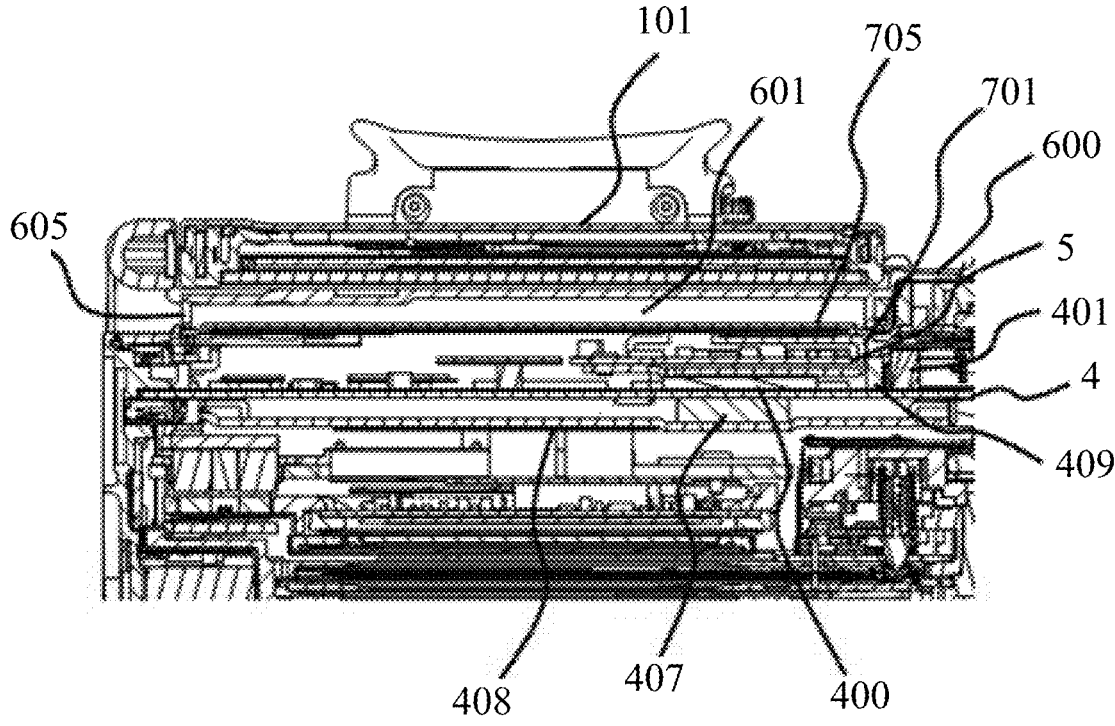

FIG. 8A shows the camera body 1 viewed from the back side, and FIG. 8B shows a part of the cross section taken along the line A-A in FIG. 8A. As shown in FIG. 8B, inside the camera body 1, various units are arranged so as to be stacked in the front-back direction, and the main board 4 is arranged near the back of the camera body 1. The duct heat sink 705 is arranged on the opposite side of the main board 4 across the power supply board 5 and the plate 701, overlapping the power supply board 5 separated by a distance.

As described above, a function of the duct 601 formed by the duct heat sink 705 and the duct-forming part of the back cover 600 is to cool the inside of the camera body 1 by airflow. Specifically, the cooling is performed when heat generated from the image processing IC 400 mounted on the main board 4 and released into the space inside the duct 601 through the plate 701 and duct heat sink 705 is transmitted outside by the air flow.

Apart of the main board 4 on which the image processing IC 400 is mounted is thermally connected to a heat sink 408 via the thermally conductive rubber 407 provided on its back side. Thereby, the heat of the image processing IC 400 is also transmitted from the back surface of the main board 4 to the heat sink 408, and is diffused throughout the camera body 1. The heat sink 408 is a component made by press-molding an aluminum plate material. Further, as shown in FIG. 8B, the power supply board 5 is arranged between the main board 4 and the duct 601, and a thermally conductive rubber 409 is arranged between the first card slot 401 and the plate 701. Heat generated during writing in the first card slot 401, which is another heat source, is transferred to the plate 701 and further to the duct 601 by bringing the thermally conductive rubber 409 into contact with the first card slot 401, and is dissipated.

Figure 9:
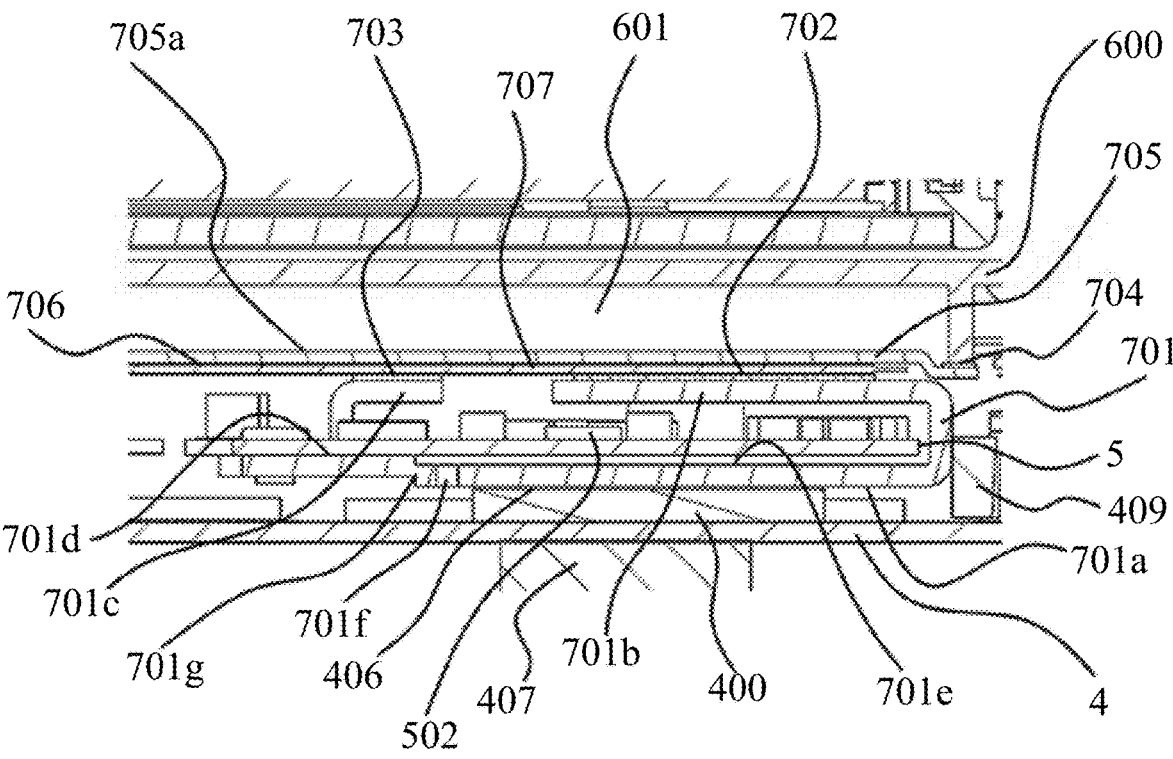
FIG. 9 is an enlarged cross-sectional view of the vicinity of a heat source in the image pickup apparatus according to the first embodiment.

FIG. 9 shows an enlarged view of an area near the image processing IC 400 in the cross section of FIG. 8B, showing a stacked configuration from the image processing IC 400 to the duct 601. As described above, the thermally conductive rubber 406 is attached to a surface (upper surface in the figure) of the image processing IC 400 mounted on the main board 4. The thermally conductive rubber 406 is in pressure contact with the plate 701 and is thermally connected to the thin heat dissipation component 707 and then to the duct heat sink 705 via the thermally conductive rubber 702 attached to the first heat transfer part 701b of the plate 701. This forms a main heat transfer path from the image processing IC 400, which is the heat source, to the duct 601.

As described above, in the thin heat dissipation component 707 fixed to the duct heat sink 705 with the wide surface, heat is spread in an in-plane direction and also transmitted in a plate thickness direction, and as a result, the heat is transmitted to the duct heat sink 705. When the heat is transmitted to the duct heat sink 705, the heat is released from a surface 705a of the duct heat sink 705 to the air inside the duct 601. The air in the duct 601, whose temperature is increased by this heat, is pushed out of the duct 601 by the airflow from the accessory 900 and discharged to the outside through the opening 605 shown in FIG. 8B and the openings 604, 611, 612, 617 shown in FIGS. 1B and 2.

Next, the heat transfer path of the heat generated in the power supply board 5 will be explained. The plate 701 which is in pressure contact with the thermally conductive rubber 406 attached to the surface of the image processing IC 400 is fixed to the camera body 1 by co-tightening with the main board 4 using screws. The power supply board 5 is fixed to the plate 701 with screws. The power supply board 5 contacts the plate 701 only on the fixing surface 701d shown in FIG. 9. A part of the plate 701 adjacent to the fixing surface 701d is the escape surface 701e with which the thermally conductive rubber 406 contacts the surface on the image processing IC side. That is, a step is provided between the fixing part of the plate 701 where the fixing surface 701d is provided and the heat receiving part where the heat receiving surface 701a and the escape surface 701e are provided. As a result, a gap is formed between the power supply board 5 and the plate 701.

By providing the step between the heat receiving part and the fixing part of the plate 701 as described above, a plate thickness of a connecting part 701g that connects the step becomes smaller than plate thicknesses of other parts (the heat receiving part, the fixing part, the first heat transfer part 701b, and the second heat transfer part 701c). As a result, a heat transfer cross-sectional area of the part between the heat receiving part and the fixing part becomes smaller than heat transfer cross-sectional areas of the other parts, making it difficult for the heat generated in the image processing IC 400 to be transferred from the heat receiving part to the fixing part (heat transfer is reduced). Furthermore, a plurality of through holes 701f are provided near the connecting part 701g in the fixing part of the plate 701 (at a position on the heat receiving part side). This reduces the heat transfer cross-sectional area from the heat receiving part side to the fixing part side in the plate 701, making it difficult for the heat generated by the image processing IC 400 to be transferred to the fixing part. The through holes 701f may be provided between the heat receiving part and the fixing part in the plate 701.

A non-heat resistant element 502 that should be avoided from high temperatures is mounted on the power supply board 5, and in order to protect this non-heat resistant element 502, a configuration that makes it difficult for heat to be transmitted to the entire power supply board 5 is required. For this reason, the step (escape surface 701e) is provided in the plate 701 to prevent the plate 701 from contacting the power supply board 5 in the area where the non-heat resistant element 502 is mounted, and also to prevent heat transfer from the heat receiving part to the fixing part in the plate 701.

The second heat transfer part 701c, which is bent from the fixing surface 701d of the plate 701 into the U-shape as described above, is thermally connected to the thin heat dissipation component 707 via the thermally conductive rubber 703. Thereby, the heat generated in the power supply board 5 is transmitted to the thin heat dissipation component 707.

Figure 10A:
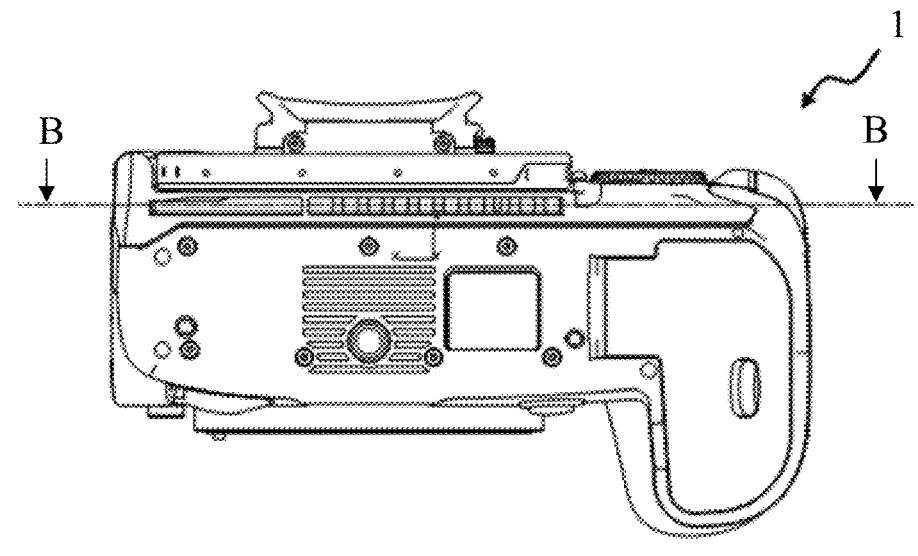
FIGS. 10A and 10B are a cross-sectional view of a duct of the image pickup apparatus according to the first embodiment.
Figure 10B:
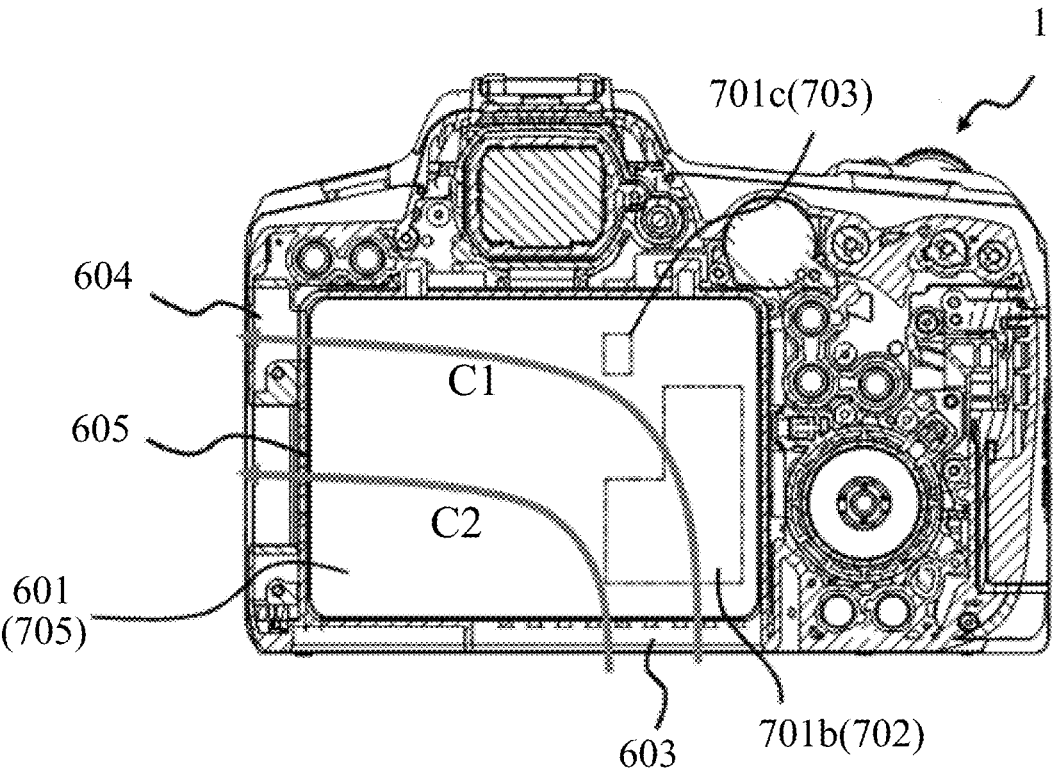

FIG. 10A shows the camera body 1 viewed from the bottom side, and FIG. 10B shows the cross section taken along the line B-B in FIG. 10A. In FIG. 10B, a position of the thermal connection of the first heat transfer part 701b (the thermally conductive rubber 702) and the second heat transfer part 701c (the thermally conductive rubber 703) in the duct 601 (the duct heat sink 705) is shown with a double-dashed line.

As shown in FIG. 10B, air transmitted from the accessory 900 to the opening 603 mainly flows through the duct 601 as shown by arrows C1 and C2 and flows out from the openings 604 and 605 of the back cover 600. Although the back cover 600 is also provided with the openings 611, 612, and 617, their opening areas are considerably smaller than those of the openings 604 and 605, so most of the air flows out through the openings 604 and 605.

A feature of this embodiment is that the first heat transfer part 701b is thermally connected to the duct 601 (the duct heat sink 705) at a position closer to the opening 603 than the openings 604 and 605 (on an upstream side of the air flow). Further, the second heat transfer part 701c is thermally connected to the duct 601 on a downstream side of the first heat transfer part 701b.

Figure 11:
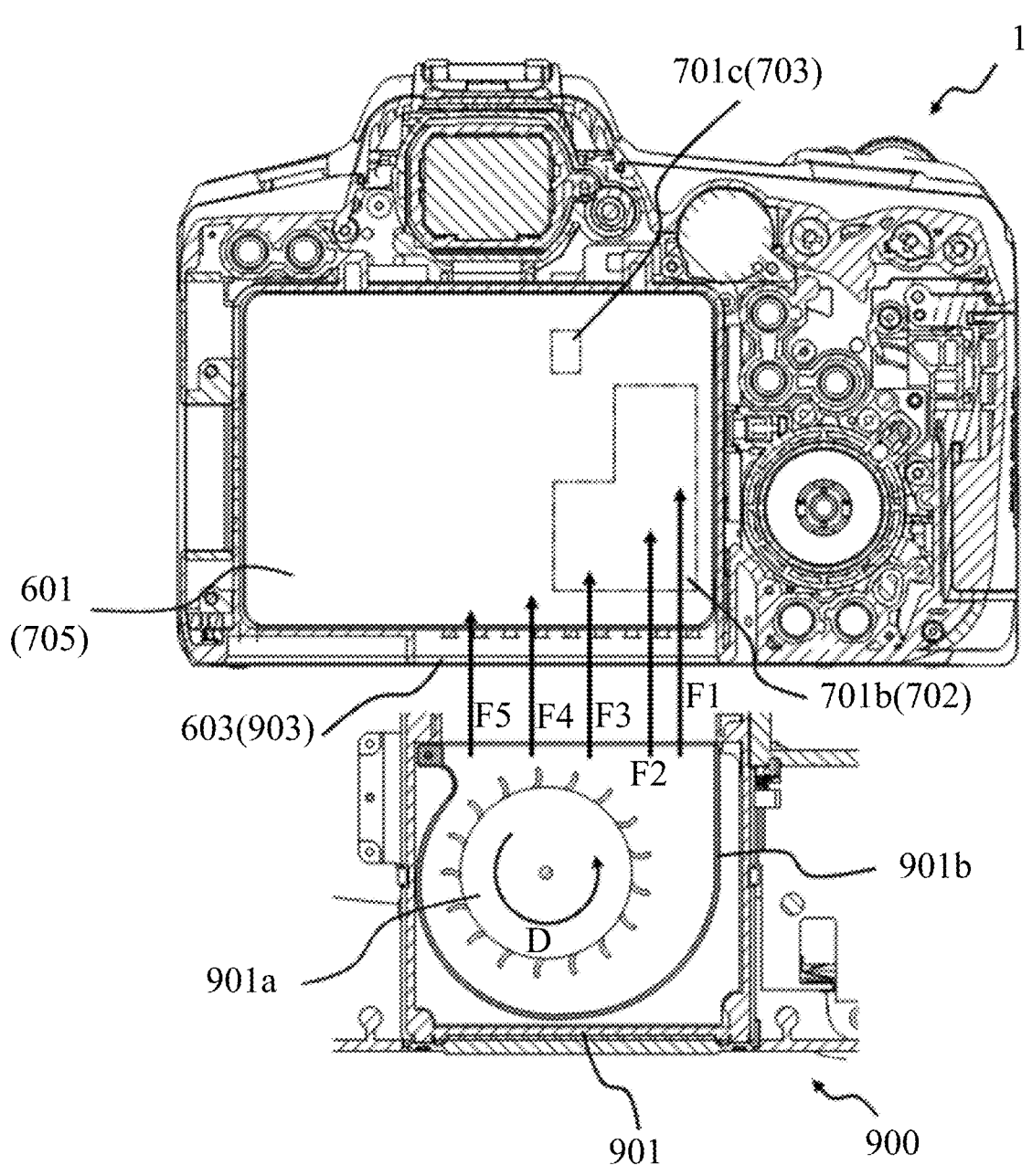
FIG. 11 is a schematic diagram of the duct of the image pickup apparatus according to the first embodiment.

FIG. 11 schematically shows a relationship between the position of the thermal connection of the first heat transfer part 701b and the second heat transfer part 701c to the duct 601 and flow quantity (or flow velocity) of air flowing out of the fan 901 in the accessory 900. The actual fan 901 is arranged parallel to the bottom surface of the camera body 1 as shown in FIG. 4 but in FIG. 11, for the sake of explanation, the fan 901 is arranged perpendicular to the bottom surface of the camera body 1. Further, in FIG. 11, a centrifugal fan is shown as the fan 901.

When a rotating blade 901a of the fan 901 is rotated around an axis in a direction of an arrow D, air sucked in from an axial direction is transmitted out in a radial direction by a centrifugal force received from the rotating blade 901a. The transmitted air is guided by a wall part of a fan case 901b and flows into the duct 601 through the air outlet 903 of the accessory 900 and the opening 603 of the camera body 1.

The flow velocity of the air flowing into the duct 601 is not uniform in a width direction of the duct 601 (direction along the opening 603), as shown by lengths of arrows F1 to F5. Specifically, the flow velocity of the air flowing into an area of the duct 601 at one end farthest from the axis of the fan 901, indicated by the arrow F1, is the fastest, and the flow velocities of the air flowing into areas closer to the axis than it, indicated by the arrows F2, F3, and F4, are slower in this order. In addition, the flow velocity of the air flowing into an area at the other end of the duct 601, indicated by the arrow F5, is the slowest.

As a feature of this embodiment, the first heat transfer part 701b is thermally connected to the duct heat sink 705 through the thermally conductive rubber 702 in a first area where air flowing into the duct 601 at a first flow velocity (F1 to F3) flows and where the arrow C1 passes in FIG. 10B. The first flow velocity (F1 to F3) is faster than a second flow velocity (F4, F5). The air that has flowed into the duct 601 at the second flow velocity flows through a second area passed by the arrow C2 in FIG. 10B. Furthermore, the first heat transfer part 701b is arranged so that a longitudinal direction of the area where it is thermally connected to the duct heat sink 705 follows a direction of the air flow into the duct 601 at the first flow velocity.

On the other hand, the second heat transfer part 701c is thermally connected to the duct heat sink 705 through the thermally conductive rubber 703 in an area of the first area in the duct 601 that is downstream of a position where the first heat transfer part 701b is thermally connected and where a flow velocity is faster than that at the position where the first heat transfer part 701b is thermally connected.

With this arrangement, the heat transmitted to the duct 601 from the first heat transfer part 701b and the second heat transfer part 701c can be efficiently released to the outside.

As explained above, in this embodiment, another heat source such as the power supply board 5 is provided between the image processing IC 400, which is the heat source, and the duct 601 formed by the back cover 600 and the duct heat sink 705. Even in this case, the heat can be transmitted from the image processing IC 400 to the duct 601 without passing through many components. By thermally connecting the first heat transfer part 701b and the second heat transfer part 701c in the area where the flow velocity of the air flowing into the duct 601 is fast due to the characteristics of the fan 901, the heat generated from the image processing IC 400 can be efficiently dissipated and the image processing IC 400 can be cooled well.

Second Embodiment

Figure 12:
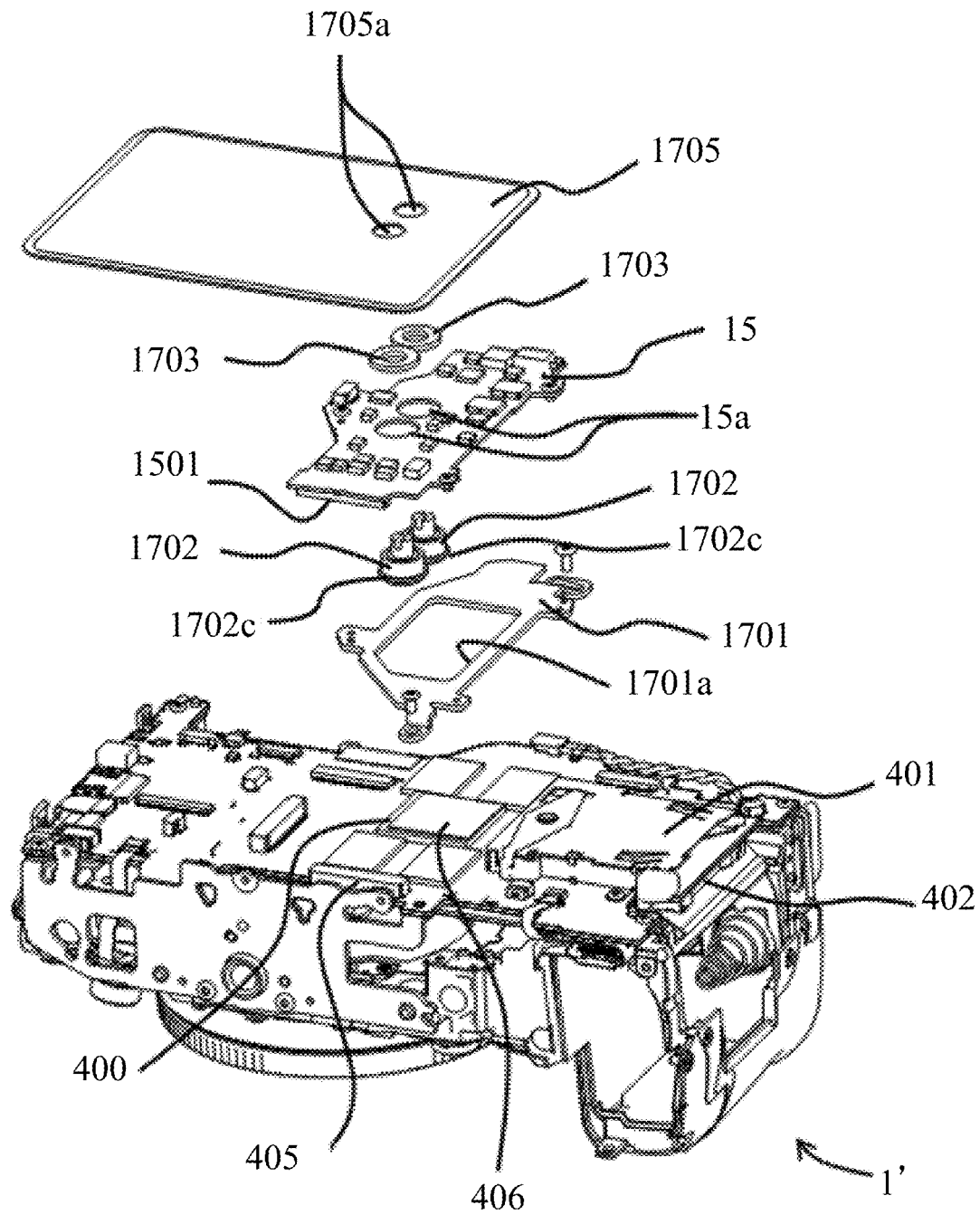
FIG. 12 is an exploded perspective view of the vicinity of a substrate of an image pickup apparatus according to the second embodiment.

Next, the second embodiment will be explained. FIG. 12 shows an exploded view of the vicinity of the power supply board 15 in the camera body 1' according to the second embodiment. Illustrations of the top cover, bottom cover, etc. are omitted. Components in this embodiment that are common to those in the first embodiment are given the same reference numerals as those in the first embodiment, and explanations thereof will be omitted.

A power supply board 15 in this embodiment differs from the power supply board 5 in the first embodiment in an arrangement of elements and wiring. Two through-holes (openings) 15a as round holes are provided in the power supply board 15 at positions overlapping the image processing IC 400 on the main board 4 in the front-back direction.

One through-hole 15a may be provided, or it may be a hole of a different shape from a round hole, such as a square. Furthermore, a part of the through hole 15a may be open at an outer edge of the power supply board 15.

The thermally conductive rubber 406 attached to the image processing IC 400 on the main board 4 is in contact with the plate 701 in the first embodiment, but in this embodiment, an opening 1701a is provided in the center of the plate 1701 and the thermally conductive rubber 406 does not contact the plate 1701. However, in a case where the opening 1701a cannot be enlarged due to strength limitations of the plate 1701, a contact area between the thermally conductive rubber 406 and the plate 1701 may be reduced compared to the first embodiment. In this embodiment, the plate 1701 is also formed of a metal material (sheet metal) such as aluminum, copper, or stainless steel.

In this embodiment, a heat transfer block 1702 that is arranged inside the through holes 15a of the power supply board 15 and the opening 1701a of the plate 1701 is provided. The heat transfer block 1702 has a thermally conductive part (heat transfer member) formed of a metal such as copper with high thermal conductivity and a heat insulating part (heat insulating member) formed of resin or rubber with lower thermal conductivity than the thermally conductive part, which is provided around the outside of the thermally conductive part. The heat transfer block 1702 has a cylindrical part that contacts the thermally conductive rubber 406 and extends through the through hole 15a in the power supply board 15 toward the duct heat sink 1705, and a flange part 1702c that is provided near the end of the cylindrical part on a side of the thermally conductive rubber 406 and has a diameter that is too large to insert into the through hole 15a. A more detailed configuration of the heat transfer block 1702 is described below.

The duct heat sink 1705 is similar to the duct heat sink 705 in the first embodiment, but differs from the duct heat sink 705 in that it has two through holes (openings) 1705a. As in the first embodiment, the duct heat sink 1705 is fixed by attaching it to the wall part of the back cover 600 so that it covers the duct-forming part of the back cover 600 with the double-sided tape 704. The through holes 1705a are provided to allow a part of the heat transfer block 1702 to protrude into the duct from the duct heat sink 1705. The thin heat dissipation component 707 and the double-sided tape 706 described in the first embodiment (FIG. 7) are not used in this embodiment.

An O-ring 1703, which is a rubber member, is arranged between the heat transfer block 1702 and the duct heat sink 1705. By sandwiching the O-ring 1703 between the heat transfer block 1702 and the duct heat sink 1705, the duct is sealed to prevent air, water, and dust from entering the camera body 1'.

Before being connected to the main board 4, the power supply board 15 is fixed to the plate 1701 with screws to form a subunit and is arranged so as to overlap the main board 4 in the front-back direction. The power supply board 15 is connected to the main board 4 by engaging a connector 1501 provided on the power supply board 15 with the connector 405 provided on the main board 4. A position of the power supply board 15 with respect to the main board 4 is also determined by the engagement of the connectors 1501 and 405. The subunit of the power supply board 15 and the plate 1701 is fixed together with the main board 4 by screws to the camera body 1'.

Figure 13:
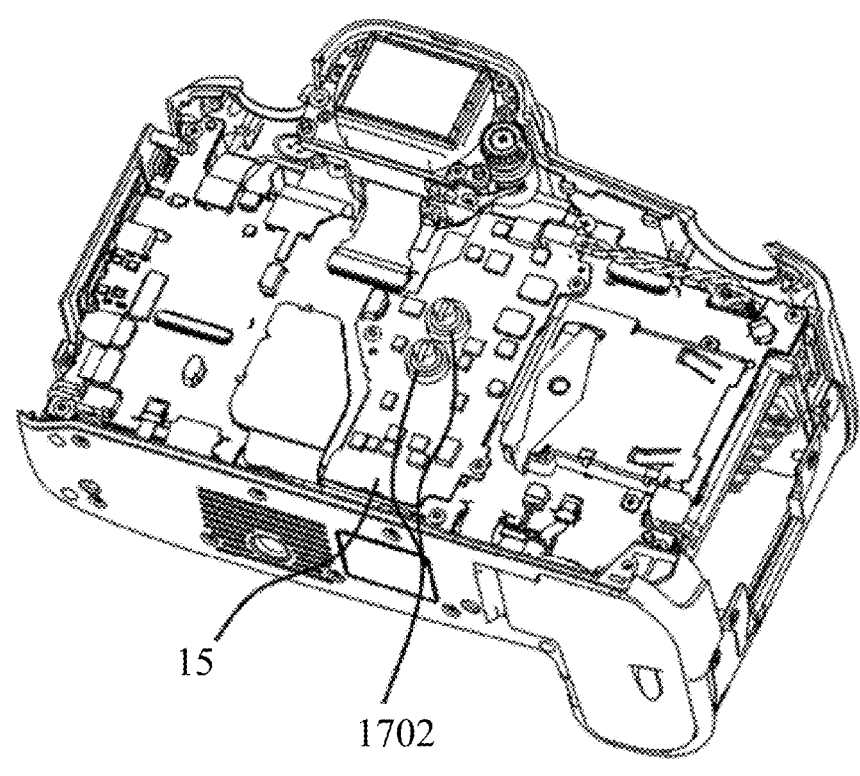
FIG. 13 is a perspective view illustrating an inside of the image pickup apparatus according to the second embodiment.

The heat transfer block 1702 is positioned by fitting its cylindrical part into an inner periphery of the through hole 15a of the power supply board 15, and its thermally conductive part contacts the thermally conductive rubber 406 attached to the image processing IC 400. When the connectors 1501 and 405 are engaged, the flange part 1702*c*, which is a part of the heat insulating part 1702*b* of the heat transfer block 1702, comes into contact with a peripheral part of the through hole 15*a* in the power supply board 15 and is pressed toward the thermally conductive rubber 406. As a result, as shown in FIG. 13, the heat transfer block 1702, which partially protrudes from the through hole 15*a* of the power supply board 15, is held (sandwiched) by the thermally conductive rubber 406 and the flange part 1702*c* pinched by the power supply board 15.

Figure 14:
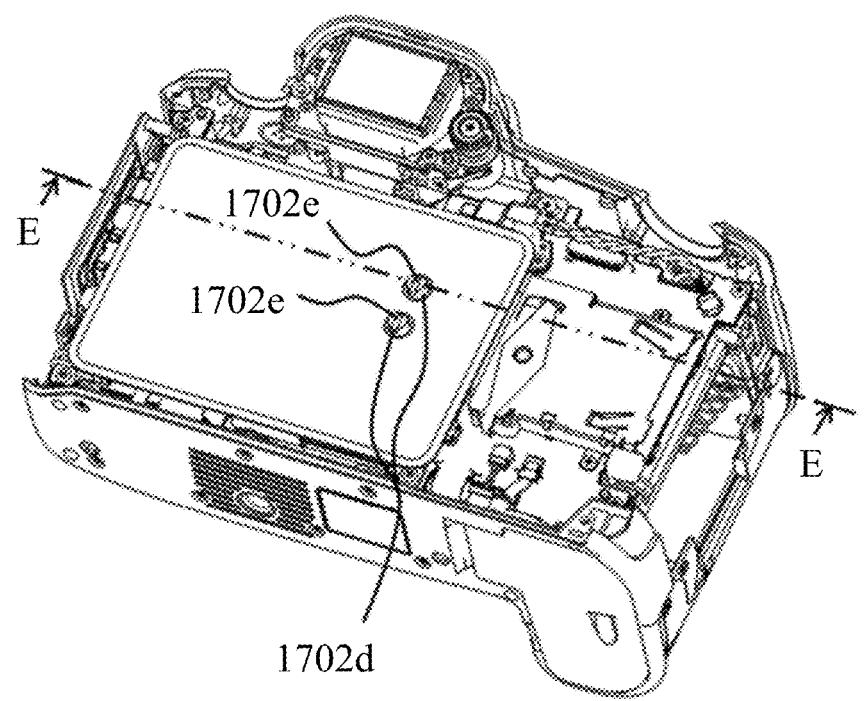
FIG. 14 is another perspective view illustrating the inside of the image pickup apparatus according to the second embodiment.

Then, the O-ring 1703 is arranged around a part of the heat transfer block 1702 that protrudes from the through hole 15*a* of the power supply board 15, and the duct heat sink 1705 is stacked thereon. As shown in FIG. 14, the protruding part 1702*d* of the heat transfer block 1702 protrudes through the through hole 1705*a* of the duct heat sink 1705 into the duct formed by the duct-forming part of the unshown back cover and the duct heat sink 1705. The protruding part 1702*d* of the heat transfer block 1702 is in direct contact with the air flowing in the duct and has a groove 1702*e* at its tip to further increase a heat dissipation area. A direction in which the groove 1702*e* extends can be changed to match a direction in which the air flows through the duct.

Figure 15:
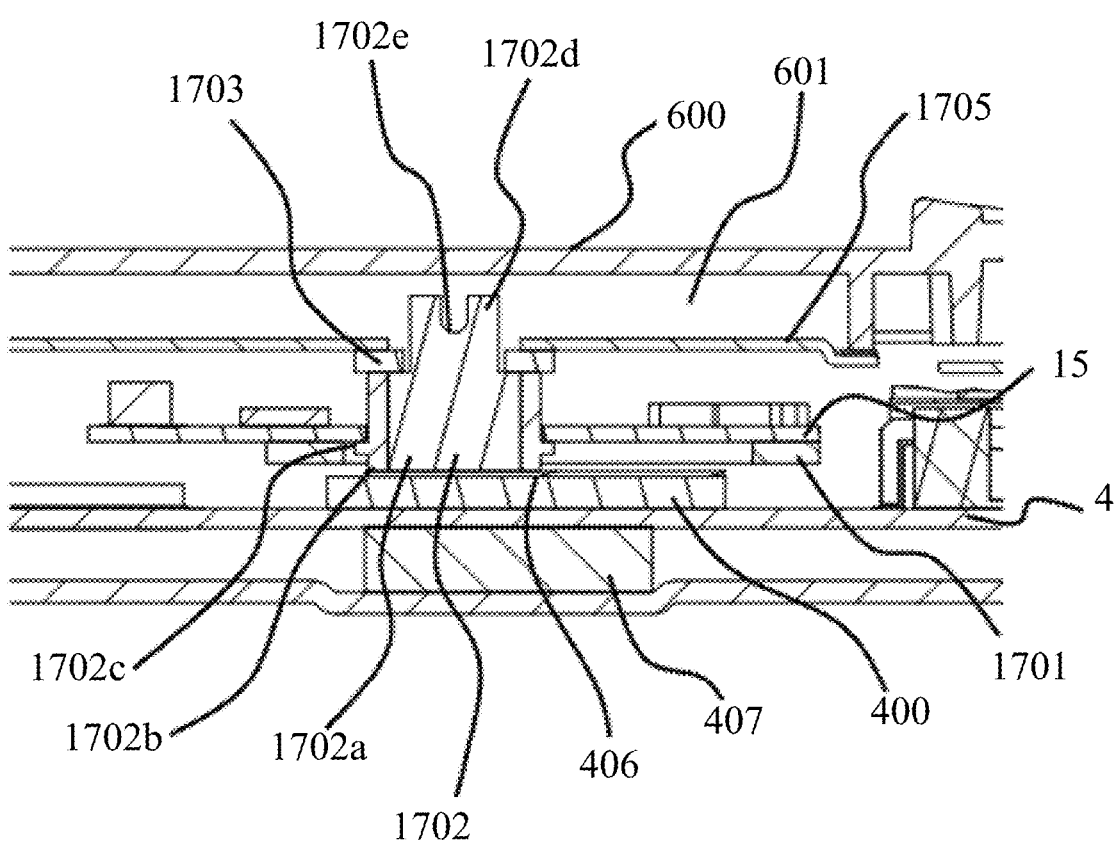
FIG. 15 is an enlarged cross-sectional view of the vicinity of a heat source in the image pickup apparatus according to the second embodiment.

FIG. 15 shows a partially enlarged cross section of the camera body 1' shown in FIG. 14 along line E-E. As described above, the thermally conductive rubber 406 is attached to the surface of the image processing IC 400 mounted on the main board 4, and the heat transfer block 1702 is in pressure contact with the thermally conductive rubber 406.

The heat transfer block 1702 has a stepped cylindrical thermally conductive part 1702*a* extending from the contact surface with the thermally conductive rubber 406 to inside the duct 601, and the heat insulating part 1702*b* surrounding the large diameter part of the thermally conductive part 1702*a* between the thermally conductive rubber 406 and the O-ring 1703. The flange part 1702*c* is formed near the end of the thermally conductive rubber 406 side in the heat insulating part 1702*b*. The protruding part 1702*d*, which is a small diameter part of the thermally conductive part 1702*a*, protrudes into the duct 601 through the through hole 1705*a* of the duct heat sink 1705. As described above, by forming the groove 1702*e* at the tip of the protruding part 1702*d* (thermally conductive part 1702*a*), the surface area can be increased and the heat dissipation efficiency can be improved. If the surface area can be increased, a fine uneven shape may be provided instead of the groove 1702*e*.

The position where the protruding part 1702*d* protrudes into the duct 601 is closer to the opening 603 than the openings 604 and 605, similar to the position where the first heat transfer part 701*b* of the plate 701 is thermally connected to the duct heat sink 705 in the first embodiment.

In this embodiment, another heat source such as the power supply board 15 is also provided between the image processing IC 400, which is the heat source, and the duct 601 formed by the back cover 600 and the duct heat sink 705. Even in this case, the heat can be transmitted from the image processing IC 400 to the duct 601 without passing through many components. In particular, in this embodiment, the heat generated in the image processing IC400 is led to the duct 601 via the shortest and thick heat transfer path formed by a small number of components, namely the thermally conductive rubber 406 and the heat transfer block 1702, which enables the temperature rise of the image processing IC400 to be quickly suppressed.

This embodiment describes a configuration in which the heat transfer block 1702 protrudes into the duct 601 through the through hole 1705*a* provided in the duct heat sink 1705. However, as in the first embodiment, it is possible to efficiently transfer the heat generated in the image processing IC 400 to the duct even in a configuration in which the heat transfer block without the protruding part 1702*d* is in contact with a duct heat sink 705 that is not provided with the through hole.

Third Embodiment

Figure 16:
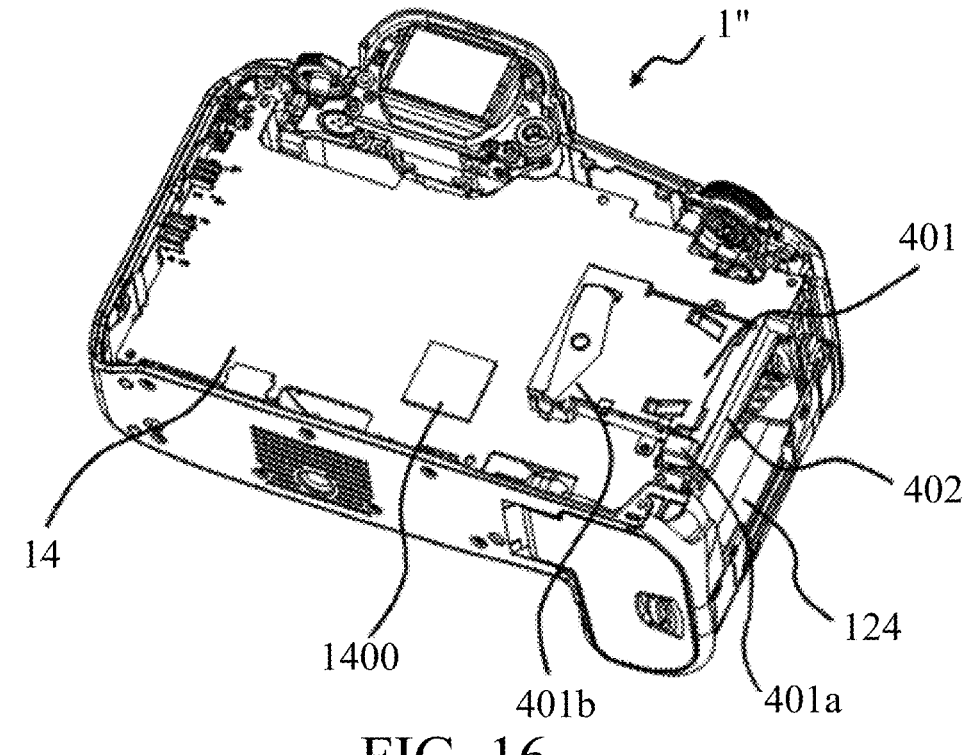
FIG. 16 is yet another perspective view illustrating an inside of an image pickup apparatus according to the third embodiment.
Figure 17:
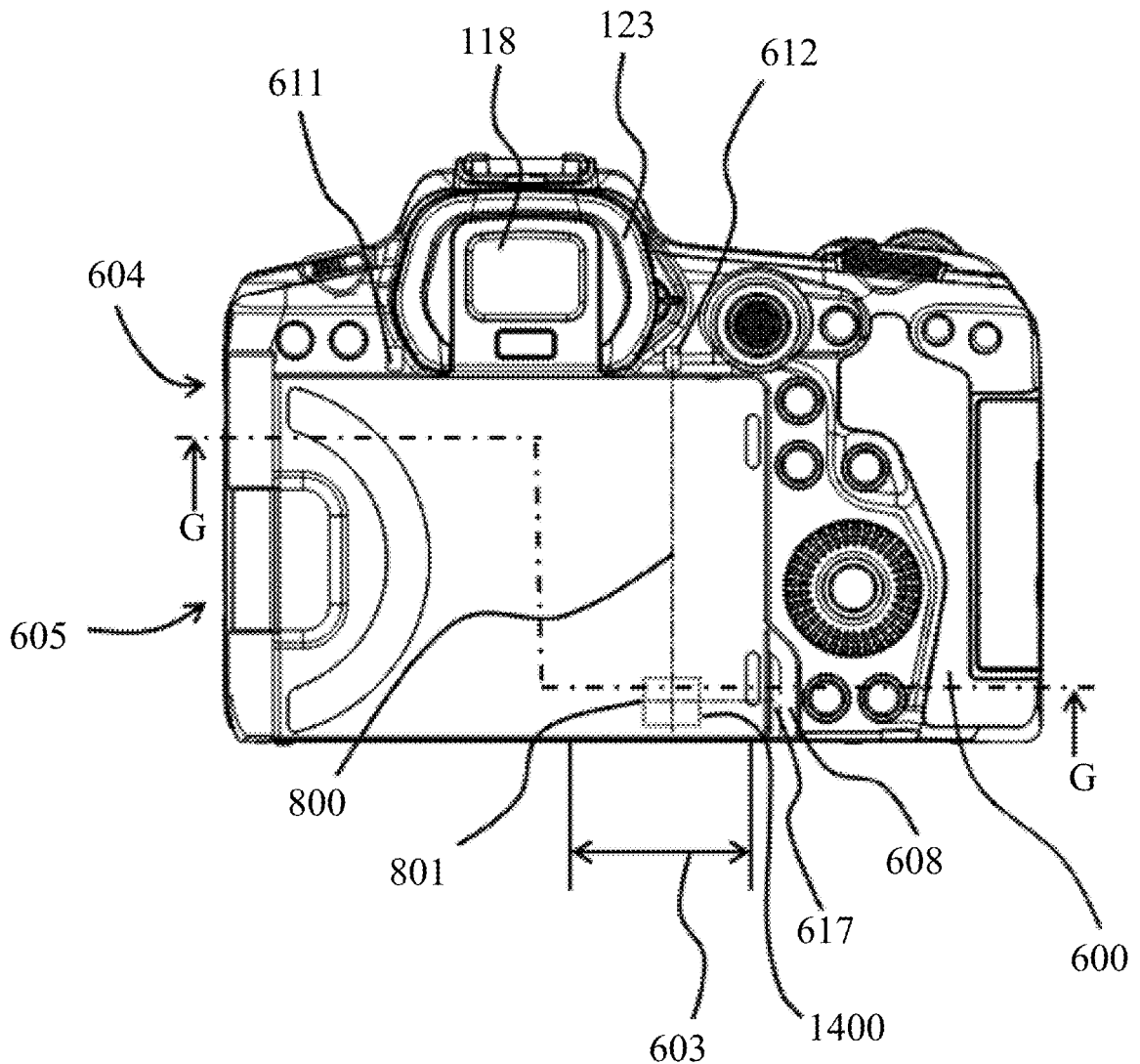
FIG. 17 is a rear view of the image pickup apparatus according to the third embodiment.

Next, the third embodiment will be explained. FIG. 16 shows the camera body 1" according to the third embodiment with the back cover removed, viewed from the back side. FIG. 17 shows the back side of the camera body 1" with the back cover 600 attached and the display unit (101) removed. The configurations of the back cover 600 and the duct heat sink 705 attached thereto to form the duct 601 are the same as those shown in the first embodiment (FIG. 7). Other than the back cover 600 and the duct heat sink 705, components in this embodiment that are common to the first embodiment are given the same reference numerals as those in the first embodiment, and the description thereof will be omitted. This embodiment differs from the first and second embodiments in a position of the image processing IC 1400 and a configuration of the main board 14.

When the accessory 900 shown in FIGS. 3 and 4 is attached to the bottom of the camera body 1" and the internal fan 901 is rotated, air flowing out from the accessory 900 flows into the duct 601 through the opening 603 of the back cover 600. The air that has passed through the duct 601 is discharged from the openings 611, 612, 604, and 605 serving as exhaust outlets.

A relationship among the openings 611, 612, 604, and 605 will be explained. As described in the first embodiment, the opening areas of the openings 611 and 612 provided on the side surface of the camera body 1" are both considerably smaller than the opening areas of the openings 604 and 605 provided on both sides of the finder 118. Due to this difference in the opening areas, the air entering the duct 601 through the opening 603 is primarily discharged through the openings 604 and 605, and the amount of the air discharged through the openings 611 and 612 is less than that discharged through the openings 604 and 605.

In a longitudinal direction of the camera body 1" (up-and-down direction in FIG. 17), the openings 611 and 612 are arranged off to the both sides from the finder 118. This arrangement can prevent the air discharged from the openings 611 and 612 from hitting the user's eyes when the user looks into the finder 118.

The opening area of the opening 611 is smaller than that of the opening 612. The opening areas of the openings 611 and 612 are made to be different from each other in order to make the amount of the air discharged from each of the openings 611 and 612 substantially the same in the air that has flowed into the duct 601 from the opening 603. By keeping the amount of the air discharged from the opening 611 and the amount of the air discharged from the opening 612 the same, the user can feel the air hitting the user's face in almost the same way whether the user looks into the finder 118 with the user's right or left eye.

Further, the opening 611 is provided closer to the openings 604 and 605 than the opening 612, and is provided on a different surface of the camera body 1" from the side surface where the openings 604 and 605 are provided. Further, the opening 611 is arranged on a surface connecting the opening 612 and the openings 604 and 605 at the upper back surface of the camera body 1.

As described in the first embodiment, the opening 617 as the third outlet (exhaust outlet) is provided on the surface of the back cover 600 that faces the recessed part 608 (the surface facing right in FIG. 17). The opening 617 opens toward the right side, which is opposite to the left side surface on which the openings 604 and 605 are provided. The opening area of the opening 617 is smaller than the opening areas of the openings 604 and 605.

The duct 601 has a constant thickness in the front-back direction, and the widths or heights of the openings 611, 612, 603, 604, and 605 are set above the thickness of the duct 601 so that the resistance to the air flowing into and out of the duct 601 is small.

In FIG. 16, the image processing IC 1400 is mounted on the main board 14, and the first card slot 401 and the second card slot 402 described in the first embodiment are attached to the main board 14 closer to the grip than the image processing IC 1400. The first card slot 401 is provided with an eject button 401*a*. When the user inserts the first card described in the first embodiment into the first card slot 401, a lever 401*b* rotates and the eject button 401*a* projects to the right in the figure. When the projected eject button 401*a* is pushed in by the user, the lever 401*b* rotates in an opposite direction to when the card is inserted, and the first card is pushed out.

Due to restrictions on arranging the image processing IC 1400 on the main board 14, a position of the first card slot 401 in the width direction of the camera body 1" may be restricted. A battery compartment 124 is provided on the front side of the main board 14, and part of the battery compartment 124 is exposed toward the outside of the camera body 1" when the card lid 300 described in the first embodiment is not present.

In FIG. 17, an area where the image processing IC 1400 is thermally connected to the duct 601 (duct heat sink 705) is indicated by a broken line. A thermally conductive rubber (not shown) is attached to the surface of the image processing IC 1400, and the heat generated in the image processing IC 1400 is transmitted to the duct heat sink 705 via the thermally conductive rubber.

As shown in FIG. 17, the image processing IC 1400 is arranged so as to be thermally connected to the duct heat sink 705 inside a line extending upward from both ends of the opening 603. Further, the opening 612 is arranged inside the line extending upward from both ends of the opening 603. In other words, in the rear view of the camera body 1", the opening 603 as an intake inlet, a thermal connection area of the image processing IC 1400 as a heat source to the duct heat sink 705, and the opening 612 as an exhaust outlet are arranged in the longitudinal direction (up-and-down direction).

In particular, in this embodiment, the position of an opening center of the opening 612 in a lateral direction (right-and-left direction) as viewed from the rear side of the camera body 1" and the position of a center of the thermal connection area of the image processing IC 1400 coincide with each other. That is, the opening center of the opening 612 and the center of the thermal connection area of the image processing IC 1400 are located on the same straight line 800 extending in the longitudinal direction.

Further, in the rear view of the camera body 1", the thermal connection area of the image processing IC 1400 to the duct heat sink 705 and the opening 617, which is the third outlet, are lined up in the lateral direction. In particular, in this embodiment, the position of the opening center of the opening 617 and the position of the center of the thermal connection area of the image processing IC 1400 coincide in the longitudinal direction when the camera body 1" is viewed from the rear side. That is, the opening center of the opening 617 and the center of the thermal connection area of the image processing IC 1400 are located on the same straight line 801 extending in the lateral direction.

By adopting the above arrangement, the image processing IC 1400 can be efficiently cooled using the air flow from the accessory 900.

Further, the accessory 900 may not be attached to the camera body 1". In this case, when the user holds the camera body 1" in a normal posture as shown in FIG. 17, the opening 603 and the thermal connection area of the image processing IC 1400 in the duct 601 are located on the same straight line 800 extending in the longitudinal direction. For this reason, the air warmed by the heat from the image processing IC 1400 in the duct 601 is smoothly discharged from the opening 612 by natural convection. Further, when the user holds the camera body 1 in a vertical posture with the grip part 120 facing upward, the opening 617 and the thermal connection area of the image processing IC 1400 in the duct 601 are located on the same straight line 801 extending in the longitudinal direction. For this reason, the air warmed by the heat from the image processing IC 1400 in the duct 601 is smoothly discharged from the opening 617 by natural convection.

In this way, by providing the opening 603 as an intake inlet and the openings 612 and 617 as exhaust outlets, the image processing IC 1400 can be cooled using natural convection even if the accessory 900 is not attached to the camera body 1".

As described above, the eyepiece cover 123 is attached to the back cover 600 around the finder 118, and the opening 611 and the opening 612 are provided on both sides of the eyepiece cover 123. The openings 611 and 612 are provided so as not to overlap the eyepiece cover 123 when viewed from the rear side. However, at least parts of the openings 611 and 612 may overlap with the eyepiece cover 123 when viewed from the rear side. By partially overlapping the openings 611 and 612 with the eyepiece cover 123, it is possible to make it difficult for the user looking into the finder 118 to feel the air discharged from the openings 611 and 612.

In each of the above embodiments, the image pickup apparatus has been described as an electronic apparatus, but the heat dissipation (cooling) structure described in the embodiments may be used in another electronic apparatus. Further, in each of the embodiments, the case has been described in which air is used as a cooling medium flowing in the duct, but it is also possible to use other cooling media (gases other than air or liquids such as water).

While the disclosure has been described with reference to embodiments, it is to be understood that the disclosure is not limited to the disclosed embodiments. The scope of the following claims is to be accorded the broadest interpretation so as to encompass all such modifications and equivalent structures and functions.

Each embodiment can provide an electronic apparatus that can efficiently dissipate heat generated by a heat generating element without increasing its size.

What is claimed is:

1. An electronic apparatus comprising:
   a first board on which a heat generating element is mounted;

a second board;

a support member which includes a fixing part to which the second board is fixed, and which supports the second board so as to overlap with the first board separated by a distance; and a heat dissipation plate which is arranged on an opposite side of the first board across the second board and the support member, so as to overlap with the second board separated by a distance, wherein the support member includes a heat receiving part which is thermally connected to the heat generating element, a first heat transfer part which transfers heat received by the heat receiving part to the heat dissipation plate, and a second heat transfer part which transfers heat received by the fixing part to the heat dissipation plate, and wherein the support member has a shape which reduces heat transfer from the heat receiving part to the fixing part.

2. The electronic apparatus according to claim 1, wherein the support member includes a portion disposed between the heat receiving part and the fixing part, the portion having a heat transfer cross-sectional area smaller than a heat transfer cross-sectional area of the heat receiving part and a heat transfer cross-sectional area of the fixing part.

3. The electronic apparatus according to claim 2, wherein the support member is formed from a sheet metal, and has a step between the heat receiving part and the fixing part, and wherein a thickness of a connecting part of the step is smaller than a thickness of each of the heat receiving part, the fixing part, the first heat transfer part, and the second heat transfer part.

4. The electronic apparatus according to claim 2, wherein a through hole is provided at a position on a side of the heat receiving part in the fixing part or between the heat receiving part and the fixing part in the support member.

5. The electronic apparatus according to claim 1, wherein the support member has a shape that does not contact the second board in an area of the second board where a non-heat resistant element is mounted.

6. The electronic apparatus according to claim 1, wherein the first board and the second board are arranged so that the heat generating element, the second board, and a part of the first heat transfer part that is thermally connected to the heat dissipation plate overlap with one another separated by a distance.

7. The electronic apparatus according to claim 1, wherein the heat dissipation plate forms at least a part of a duct through which a cooling medium flows, and wherein the first heat transfer part is thermally connected to the heat dissipation plate at a position closer to an inlet through which the cooling medium flows into the duct than an outlet through which the cooling medium flows out from the duct.

8. The electronic apparatus according to claim 7, wherein the first heat transfer part is thermally connected to the heat dissipation plate on an upstream side of the second heat transfer part in a direction in which the cooling medium flows in the duct.

9. The electronic apparatus according to claim 7, wherein a first area where a flow velocity of the cooling medium is fast and a second area where the flow velocity is slower than that in the first area are provided in the duct, and wherein the first heat transfer part and the second heat transfer part are thermally connected to the heat dissipation plate in the first area.

10. The electronic apparatus according to claim 1, wherein the electronic apparatus is an image pickup apparatus which has an image sensor, and where the heat generating element performs image processing on a signal output from the image sensor.

11. An image pickup apparatus comprising:

a finder into which a user looks;

a board on which a heat generating element is mounted; and a heat dissipation member to which the heat generating element is thermally connected, and which forms at least a part of a duct through which a cooling medium flows, wherein the duct includes an inlet into which the cooling medium flows, and a first outlet and second outlet though which the cooling medium flows out, wherein the inlet is provided on a bottom surface of the image pickup apparatus, wherein the first outlet is provided on a side surface of the image pickup apparatus, wherein the second outlet is provided on a side of a back surface of the image pickup apparatus where the finder is located, such that the second outlet does not overlap with the view finder in short-side direction of the finder.

12. The image pickup apparatus according to claim 11, wherein in a rear view of the image pickup apparatus, the inlet, an area of the heat dissipation member to which the heat generating element is thermally connected, and the second outlet are arranged in an up-and down direction of the image pickup apparatus.

13. The image pickup apparatus according to claim 11, wherein two outlets are provided on both sides of the finder as the second outlet, and wherein opening areas of the two outlets are different from each other.

14. The image pickup apparatus according to claim 11, wherein the duct includes a third outlet which opens toward a side opposite to the first outlet, and wherein in a rear view of the image pickup apparatus, the third outlet and an area of the heat dissipation member to which the heat generating element is thermally connected are lined up in a lateral direction of the image pickup apparatus.

15. The image pickup apparatus according to claim 14, wherein an opening area of the third outlet is smaller than an opening area of the first outlet.

16. The image pickup apparatus according to claim 14, wherein an opening area of the second outlet is smaller than an opening area of the first outlet.

17. The image pickup apparatus according to claim 11, further comprising an image sensor, wherein the heat generating element performs image processing on a signal output from the image sensor.

18. The image pickup apparatus according to claim 11, wherein an opening area of the second outlet is smaller than an opening area of the first outlet.

* * * * *